US011464133B2

(12) United States Patent
Scott et al.

(10) Patent No.: US 11,464,133 B2
(45) Date of Patent: Oct. 4, 2022

(54) COOLING CONTAINER

(71) Applicant: HEWLETT PACKARD ENTERPRISE DEVELOPMENT LP, Houston, TX (US)

(72) Inventors: Michael Scott, Chippewa Falls, WI (US); Bret Cuda, Chippewa Falls, WI (US); David Petersen, Chippewa Falls, WI (US); Eng Lim Goh, Singapore (SG); Mark R. Fernandez, Greer, SC (US); John Kichury, Morris Plains, NJ (US); Robert Behringer, Chippewa Falls, WI (US); Calandra Szulgit, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 580 days.

(21) Appl. No.: 16/247,350

(22) Filed: Jan. 14, 2019

(65) Prior Publication Data

US 2020/0229319 A1    Jul. 16, 2020

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20736* (2013.01); *H05K 7/20172* (2013.01)

(58) Field of Classification Search
CPC .......... H05K 7/20127; H05K 7/20136; H05K 7/20145; H05K 7/20154; H05K 7/20172;

(Continued)

(56) References Cited

U.S. PATENT DOCUMENTS 6,478,258 B1   11/2002  Yee
6,983,790 B2   1/2006   Ippoushi et al.
(Continued)

OTHER PUBLICATIONS

Boeing, "Active Thermal Control System (ATCS) Overview," Aug. 29, 2017, pp. 1-19, Retrieved from the Internet on Jul. 24, 2018 at URL: <web.archive.org/web/20170829114606/https://www.nasa.gov/pdf/473486main_iss_atcs overview.pdf>.

(Continued)

*Primary Examiner* — Ko-Wei Lin
(74) *Attorney, Agent, or Firm* — Mahamedi Paradice LLP (57) ABSTRACT

Example containers are provided to retain and cool electronic devices in environments where power and/or coolant (e.g., airflow) is limited or finite. In examples, a container can include a housing and a conduit system. The housing can include a plurality of sides including a front side and a back side, and can be structured to retain at least a first computing device. In addition, the housing can provide for a first and second inlet opening and a first and second outlet opening on the back side of the container. The conduit system can be provided within the housing to guide the airflow received from each of the first and second outlet openings through an interior volume of the container to cause the airflow to exit from each of the first and second outlet openings. Further, the conduit system can include a plurality of structures that combine to guide at least a portion of the airflow received through the first and second inlet openings through a top region of the interior volume as the airflow is moved from the back side of the container to the front side of the container. Further still, the conduit system can guide at least a portion of the warmed airflow to a bottom region of the interior volume as the warmed airflow is moved from the front side to the back side of the container.

19 Claims, 6 Drawing Sheets

(58) Field of Classification Search
CPC .......... H05K 7/20718; H05K 7/20727; H05K 7/20736; G06F 1/20
USPC ................. 454/184; 361/688, 690, 701, 703
See application file for complete search history.

(56) References Cited

U.S. PATENT DOCUMENTS

| | | | | |
|---|---|---|---|---|
| 7,436,664 | B2* | 10/2008 | Hori ........................ | G06F 1/20 165/121 |
| 7,561,425 | B2 | 7/2009 | Mindock et al. | |
| 7,843,685 | B2* | 11/2010 | Beauchamp ............. | G06F 1/20 361/679.49 |
| 8,035,972 | B2 | 10/2011 | Ostwald et al. | |
| 8,054,625 | B2* | 11/2011 | Noteboom .......... | H05K 7/2079 361/688 |
| 8,867,207 | B2* | 10/2014 | Wei ......................... | G06F 1/20 361/695 |
| 8,894,477 | B2* | 11/2014 | Lee .................... | H05K 7/20972 454/184 |
| 9,414,516 | B2* | 8/2016 | Chin .................. | G02F 1/133385 |
| 2009/0260384 | A1 | 10/2009 | Champion et al. | |
| 2013/0267161 | A1* | 10/2013 | Iqbal ................. | H05K 7/20745 454/184 |
| 2013/0295834 | A1* | 11/2013 | Faist .................. | H05K 7/20736 454/184 |
| 2014/0098493 | A1* | 4/2014 | Chen .................. | H05K 7/20145 361/692 |
| 2015/0216077 | A1* | 7/2015 | Tanaka .............. | H05K 7/20909 361/697 |
| 2016/0105994 | A1* | 4/2016 | Hwang .............. | H05K 7/20745 361/695 |
| 2016/0124473 | A1* | 5/2016 | Lin .......................... | G06F 1/20 361/679.49 |
| 2016/0353604 | A1* | 12/2016 | Lavie ...................... | H04B 1/38 |
| 2017/0086336 | A1* | 3/2017 | Matsuoka .......... | H05K 7/20909 |
| 2017/0172016 | A1* | 6/2017 | Kang ..................... | G09F 9/33 |
| 2017/0354060 | A1* | 12/2017 | Pedoeem ........... | H05K 7/20145 |
| 2018/0132379 | A1* | 5/2018 | Cacho Alonso ....... | H05K 7/206 |
| 2018/0356112 | A1* | 12/2018 | Lin ........................ | F24F 11/77 |
| 2019/0246527 | A1* | 8/2019 | Ionescu .............. | H05K 7/20181 |
| 2020/0120831 | A1* | 4/2020 | Saito .................. | H05K 7/20763 |
| 2021/0234215 | A1* | 7/2021 | Nakahama ........ | H01M 10/6563 |

OTHER PUBLICATIONS

ESA, "Columbus: Europe's Laboratory on the International Space Station," Oct. 1999, pp. 1-39, BR-144.

* cited by examiner

Guiding Airflow Received From Each Of A First Inlet Opening And A Second Inlet Opening Through The Interior Volume Of The Container, To Cause The Airflow To Exit From Each Of A First Outlet Opening And A Second Outlet Opening (310)

Wherein The First Inlet Opening, The Second Inlet Opening, The First Outlet Opening, And The Second Outlet Opening Are Each Located On A Backside Of The Container (320)

Wherein Guiding The Airflow Includes:

Guiding At Least A Portion Of The Airflow Received Through The First Inlet Opening And The Second Inlet Opening Through A Top Region Of The Interior Volume As The Airflow Is Moved From The Backside Of The Container To A Front Side Of The Container (322)

Guiding At Least A Portion Of The Warmed Airflow To A Bottom Region Of The Interior Volume As The Warmed Airflow Is Moved From The Front Side Of The Container To The Back Side Of The Container (324)

FIG. 3

COOLING CONTAINER

BACKGROUND

Electronic devices, such as computing devices (e.g., servers), generate heat as a by-product of their operation. As such devices become more sophisticated, the devices become more prone to overheating. To allow for heating, computing devices utilize fans or cooling systems, under an assumption that power for such cooling systems is readily available.

DETAILED DESCRIPTION

Example containers are provided to retain and cool electronic devices in environments where power and/or coolant (e.g., airflow) is limited or finite.

In examples, a container can include a housing and a conduit system. The housing can include a plurality of sides including a front side and a back side, and can be structured to retain at least a first computing device. In addition, the housing can provide for a first and second inlet opening and a first and second outlet opening on the back side of the container. The conduit system can be provided within the housing to guide the airflow received from each of the first and second outlet openings through an interior volume of the container to cause the airflow to exit from each of the first and second outlet openings. Further, the conduit system can include a plurality of structures that combine to guide at least a portion of the airflow received through the first and second inlet openings through a top region of the interior volume as the airflow is moved from the back side of the container to the front side of the container. Further still, the conduit system can guide at least a portion of the warmed airflow to a bottom region of the interior volume as the warmed airflow is moved from the front side to the back side of the container.

In examples, the operational environment of the container is a space station, such as the International Space Station ("ISS"). In space, the lack of natural atmosphere environment can cause a retained electrical device (e.g., retained server or other computing device) to increase its internal temperature beyond operational parameters under significantly lesser use than would otherwise occur in a normal operating environment. Moreover, space stations are closed systems, meaning resources such as air are finite, and energy is similarly limited. In specific examples, the ISS can employ rules and design parameters that restrict the availability, location and orientation of cool airflow. Moreover, the amount of energy that is available for cooling is limited, making use of fans or drivers costly.

As used herein, "substantially" in the context of a quantitative and comparative term means at least 60% of the compared quantities. In addition, an airflow is said to "evenly" cool a given surface or volume if its passage across the given surface or through the volume, during expected or anticipated operation conditions, has an effect of causing a change in temperature that, when measured across the given surface or volume, is within a predetermined threshold amount.

Figure 1:
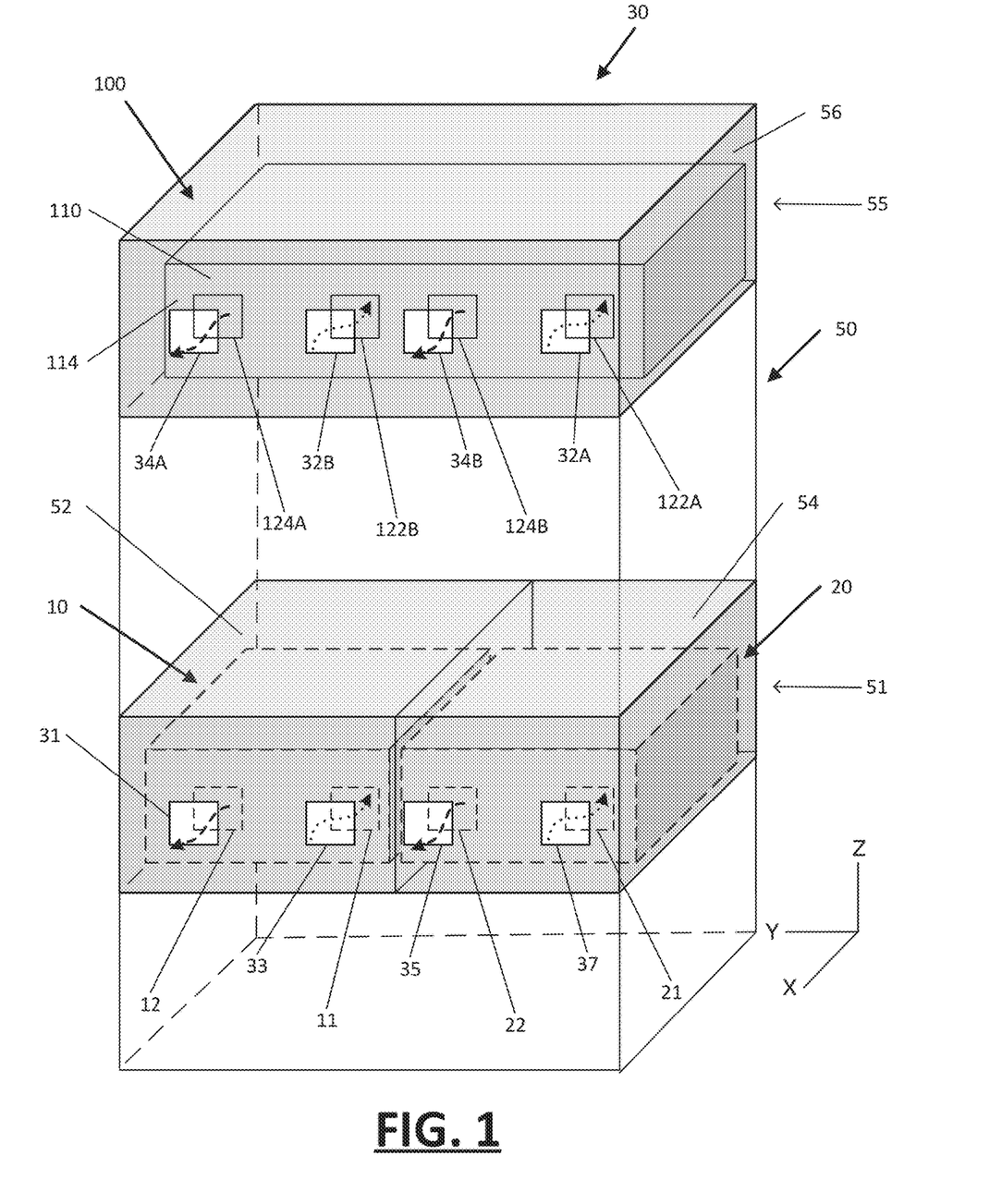
FIG. 1 illustrates an isometric rear view of an example cabinet assembly.

FIG. 1 is an isometric rear view of an example cabinet assembly. Containers 10, 20 provide examples of containers in individual container bays, while container 100 provides an example of a container that spans two container bays.

In the example of FIG. 1, a cabinet assembly 30 can include a cabinet 50 and a container 100, where the container 100 is structured to retain and cool a heat-generating device in an environment such as provided by the ISS. The cabinet assembly 30 can include multiple levels. For example, the cabinet 50 can include a cabinet housing to provide a pair of container bays 52, 54 on at least a first level 51. Each container bay 52, 54 can receive a suitably dimensioned container (e.g., container that spans less than half of the overall width of the cabinet). Each container bay 52, 54 can further supply each container with coolant and exhaust, via the respective coolant and exhaust conduits that are available through each container bay.

Each of the pair of container bays 52, 54 can include a first cabinet opening to receive a coolant conduit and a first cabinet opening to receive an exhaust conduit. For example, in FIG. 1, the container bay 52 can include a first cabinet opening 33 to receive the coolant conduit (not shown) and a first cabinet opening 31 to receive the exhaust conduit (not shown). In addition, the container bay 54 can include a first cabinet opening 37 to receive the coolant conduit (not shown) and a first cabinet opening 35 to receive the exhaust conduit (not shown).

While individual container bays can each receive heat-generating devices, the dimensions of the cabinet and the container bays, as well as the location of the coolant conduits and exhaust conduits (e.g., pipes) may be fixed, and thus represent design constraints for the cabinet. Under specifications used by NASA with the ISS, for example, a single bay is not wide enough to receive a container to retain a rack-type server. While a level of the cabinet can be structured to allow for a container to span the pair of container bays on a level (e.g., container 100), the resulting container is restricted to using coolant and exhaust conduits that are designed for smaller containers which fit in single bays (e.g., containers 10, 20). Since the position of the coolant and exhaust conduits are fixed constraints, the container to span the pair of container bays must utilize pairs of coolant conduits and exhaust conduits that have a staggered arrangement, meaning each inlet opening is positioned adjacent to an outlet opening. The staggered arrangement between the inlets and outlets means that the container must pass cool air adjacent to warm air.

As such, the cabinet 50 can include a cabinet housing to provide a container bay 56 on at least a second level 55. The container 100 can be mounted in the container bay 56 and can include a housing dimensioned to extend across each container bay of the pair of container bays 52, 54. The container bay 56 can include first and second cabinet openings 32A, 32B to receive the coolant conduits (not shown), and first and second cabinet openings 34A, 34B to receive the exhaust conduits (not shown). Further, a back side 114 of the container 100 can include first and second inlet openings 122A, 122B, and first and second outlet openings 124A, 124B. The container 100 can be structured so that the first and second inlet openings 122A, 122B align with the first and second cabinet openings 32A, 32B, respectively, to receive the coolant conduits, and so that the first and second outlet openings 124A, 124B align with the first and second cabinet openings 34A, 34B to receive the exhaust conduits.

In examples, the cabinet 50 can correspond to a frame, enclosure or fixture for receiving containers 10, 20 and 100, as well as other devices or structures (including additional containers). As illustrated in FIG. 1, the container 10 can be mounted in container bay 52, and the container 20 can be mounted in container bay 54. The containers 10, 20 can be structured to cool computing devices (or other electronic devices) retained within by receiving a cool airflow through an inlet and expelling a warmed airflow through an outlet. For example, in FIG. 1, the container 10 can include an inlet 11 to receive a cool airflow and an outlet 12 to expel a warmed airflow, and the container 20 can include an inlet 21 to receive a cool airflow and an outlet 22 to expel a warmed airflow. The containers 10, 20 are independent from one another in that the airflow between inlet 11 and outlet 12 cools the computing devices retained within the container 10, and the airflow between inlet 21 and outlet 22 cools the computing devices retained with the container 20.

Unlike containers 10, 20, which can be structured to span approximately half the width of the cabinet 50 so that containers 10, 20 can be positioned adjacent to one another along a horizontal axis of the cabinet 50 (e.g., Y-axis), the container 100 can be structured to span approximately the entire width of the cabinet 50 in order to retain larger computing devices (e.g., slot or rack servers) that cannot be dimensionally retained within the containers 10, 20. Moving right to left along the Y-axis of the rack 50 in FIG. 1, the containers 20, 10 include the inlet 21 to receive cool airflow, the outlet 22 to expel warmed airflow, the inlet 11 to receive cool airflow and the outlet 12 to expel warmed airflow. The colinear alignment as well as the alternating arrangement of the inlets and outlets (e.g., each inlet being adjacent to an outlet) can be carried over to the container 100 in order to comply with the design constraints imposed by the ISS. As such, moving right to left along the Y-axis of the rack 50 in FIG. 1, on the back side 114 of the housing 110, the container 100 includes a first inlet opening 122A to receive cool airflow, a second outlet opening 124B to expel warmed airflow, a second inlet opening 122B to receive cool airflow, and a first outlet opening 124A to expel warmed airflow.

Moreover, the inlet and outlet openings being positioned on the back side of the container is not conducive to designs of servers and other rack-mounted servers, which are normally designed to receive airflow that is passed from front to back over a surface of the computer. As such, the container 100 can include a conduit system. The conduit system can be provided within a housing 110 of the container 100 to guide the airflow received from each of the first and second inlet openings 122A, 122B through an interior volume of the container 100, and to cause the airflow to exit from each of the first and second outlet openings 124A, 124B. Further, the conduit system can include a plurality of structures to guide at least a portion of the airflow received through the first and second inlet openings 122A, 122B through a top region of the interior volume as the airflow is moved from the back side 114 to the front side of the container. Further still, the conduit system can include a plurality of structures to guide at least a portion of the warmed airflow to a bottom region of the interior volume as the warmed airflow is moved from the front side to the back side 114 of the container 100.

Figure 2A:
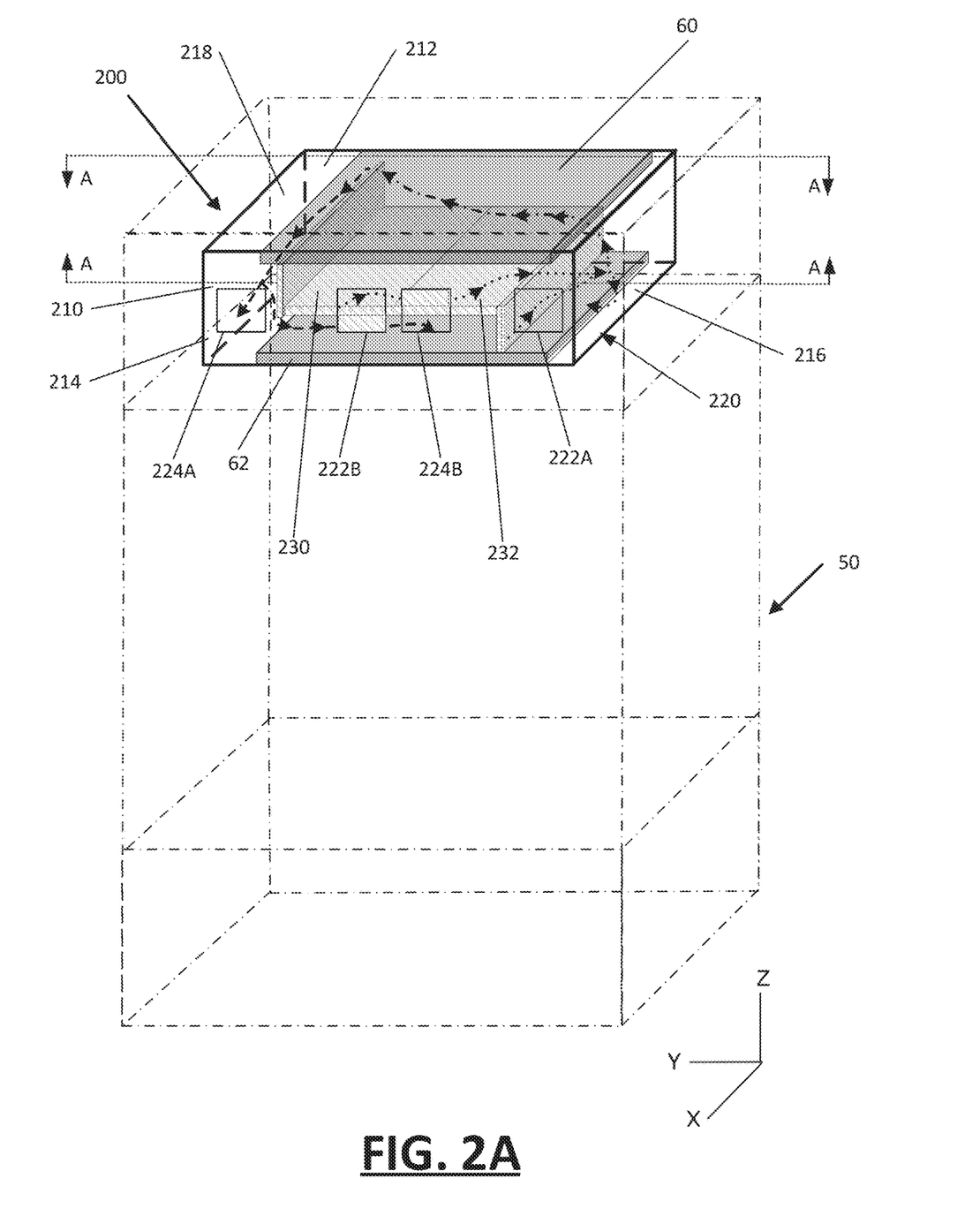
FIG. 2A is an isometric rear view of another example container, shown with heat-generating devices assembled and operative therein.

FIG. 2A is an isometric rear view of another example container, shown with heat-generating devices assembled and operative therein. In an example of FIG. 2A, a container 200 is mounted to the cabinet 50, with two computing devices 60, 62 (e.g., rack-mounted computers) assembled within a volume or region that is to be cooled. The container 200 can be structured to include features similar to, for example, the container 100 of an example of FIG. 1. Accordingly, the container 200 can include a housing 210, with front side 212, back side 214, and opposing lateral sides 216, 218. With an example of FIG. 2A, the container 200 also includes a conduit system 220 that is structured to include multiple inlets 222A, 222B and outlets 224A, 224B.

As discussed above, the environment where the container 200 is to be used may place design constraints on the location, dimension, and/or layout or arrangement of the inlets and outlets. As shown by an example of FIG. 2A, on the ISS, the design constraints can require that the container 200 includes a pair of inlets and outlets on a back side of the container 200. The design constraints can further provide, for example, that (i) the inlets and outlets are provided in a staggered arrangement, with each inlet being adjacent to an outlet and/or (ii) the inlets and outlets being linearly arranged.

The design constraints relating to the inlets and outlets may not be accommodating to the airflow-relevant configurations of many types of electronic devices. For example, individual bays of the container 200 may span a substantial length and width of the container in order to receive rack servers. Rack servers typically require a significant amount of cooling. Moreover, rack servers typically position heat generating components towards the middle and back of the device's housing. Many server housings also include fans and/or other heat sinks at the very back of the server housing, so as to draw warm air away from the electronic devices, in front of the heat sink, and out the back of the computing devices. The conduit system 220 can generate sufficient cooling from the inlets and outlets to enable the bays to receive and operate servers (or other devices with similar air-relevant configurations), in environments such as the ISS despite the design constraints of the ISS. In particular, the conduit system 220 can receive cool air at the back side via the inlets and guide the cool air past the bays from back to front (rather than front to back, in accordance with the configurations of the servers) and further guide warmed airflow from front to back, while generating sufficient cooling for the servers. In this way, examples provide for a conduit system maintained within the housing of the container to best utilize the available resources and to provide adequate cooling capacity within the container so the computing devices can operate as if they were operating under normal environmental conditions.

The conduit system 220 can guide the airflow through a series of conduit structures (e.g., 230, 232), to change the direction and speed of the airflow. The conduit system 220 can change the direction of the airflow by about 180 degrees, so that spent airflow can be recaptured. The conduit system 220 can also be structured to slow the airflow, so that warmer air is exposed to retained devices for a longer duration as compared to cool air (e.g., air received near the first inlet opening 222A). By increasing the time exposure of retained devices to warmed airflow, as compared to the timed exposure of cool airflow, the conduit system 220 can create a substantially even or uniform cooling effect on electrical devices that are retained within a device bay 140. In this way, the container 200 can employ the conduit system 120 to effectively and substantially uniformly cool device(s) retained in the container 200, without use of airflow that crosses-over or under the retained devices, even when such devices are designed or intended to be used for such types of airflow. In addition, the conduit system 220 can be layered, to provide airflow that can cool multiple surfaces that extend substantially front-to-back (e.g., along the X-axis) and side-to-side (e.g., along the Y-axis), where the surfaces reside at different heights of the device bay of the container 200 (e.g., along the Z-axis). In this way, the airflow can be guided to evenly cool a set of racked devices (e.g., devices separated vertically, or in a third direction (Z)).

In some examples, the conduit system 220 can be passive, meaning the airflow can be provided without use of fans or air drivers. Rather, in some examples, the conduit system 220 utilizes baffles or other conduit structures (e.g., 230, 232, etc.), as well as heat exchangers, to diverge airflow, to cause directional changes that slow airflow, and/or to cause pressure variations that guide airflow along the X, Y and Z axes.

According to examples, the conduit system 220 guides each of multiple intake flows that are received via inlets 222A, 222B through a series of directional changes, resulting in multiple outtake flows being expelled through corresponding outlets 224A, 224B. For reference, intake flow refers to cool airflow that is warmed, traveling from back to front, and outtake flow refers to warmed air flow traveling from front to back. The intake and outtake flows are thus directed in substantially opposite directions to one another, such as in opposite directions along a common axis (X). The conduit system 220 can also provide crossflow in a lateral direction (Y) between intake and outtake flows. The conduit system 220 can manipulate the intake, outtake and crossflows to derive sufficient cooling for one or multiple computing devices 60, 62 in respective device bays. Moreover, the cooling effect provided by the airflow can be applied substantially uniformly along an area of each of the retained computing devices 60, 62, such that the cooled surfaces extend substantially front-to-back (e.g., along the X-axis) and side-to-side (e.g., along the Y-axis). To derive sufficient cooling, the conduit system 220 can also separate the intake flow (or cool airflow) from the outtake flow (warm airflow). In examples, the conduit system 220 guides at least a portion of the warmed airflow to a bottom region of the interior of the container 200 (e.g., along the axis Z). In particular, a portion of the outtake flow that is passed to the interior outlet is guided downward in a mid-region of the container 200, until it is expelled out of the second outlet opening 224B. In this same region, the intake flow from the second inlet opening 222B is guided upward to a top region and kept separate from the outtake flow of the bottom region.

Figure 2B:
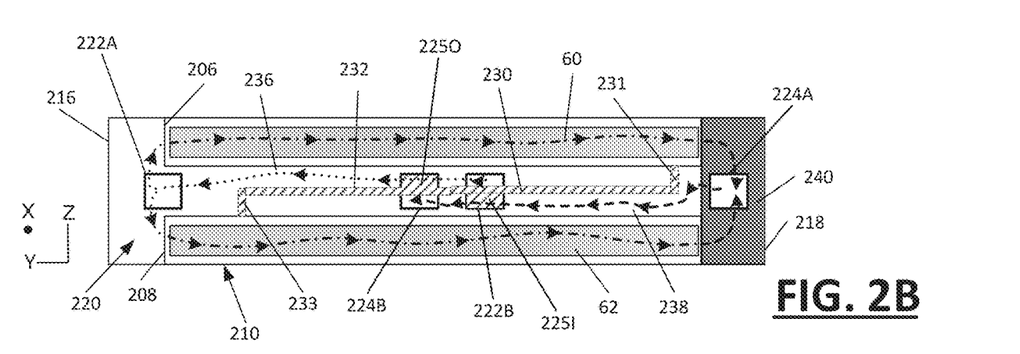
FIG. 2B illustrates a cross-sectional view of the example container of FIG. 2A, as viewed along lines A-A of FIG. 2A.

FIG. 2B illustrates a cross-sectional view of the container 200, along lines A-A of FIG. 2A. Within a housing 210 of the container 200, retention frames 206, 208 are integrated with an interior of the housing 210 to include device bays for retaining computing devices 60, 62. A region that encompasses an interior of the housing 210 (e.g., coinciding with a position of the computing devices 60, 62) can correspond to a device bay where the uniform cooling is targeted. The device bays can be represented in FIG. 2A through FIG. 2I by retention frames 206, 208 which are vertically separated along the vertical axis (e.g., Z). The arrangement of the retention frames 206, 208 can be to maximize the volume of an open region between the retention frames 206, 208 within the container 200. The region between and around the retention frames 206, 208 can be occupied with conduit structures 230, 232 and other features that collectively form the conduit system 220. In examples, each of the conduit structures 230, 232 can be dog-legged, with the conduit structure 230 extending a vertical member 231 to an underside of the retention frame 206, and the conduit structure 232 extending a vertical member 233 to a topside of the retention frame 208.

The resulting open region formed by the conduit structures 230, 232 can further enable the formation of inlet and outlet conduits 236, 238, each of which may define a portion of a path of travel of the airflow through the interior of the container 200. The inlet and outlet conduits 236, 238 can provide for airflow to extend between lateral sides 216, 218, and between the front and back sides 212, 214. Further, the conduits can include a collection region 240, such as positioned near the lateral side 218 of the container 200.

The inlet conduit 236 can define the intake flows received by multiple inlets, such as through each of the first and second inlets 222A, 222B. Likewise, the outlet conduit 238 can define the outtake flows expelled through multiple outlets, such as the respective first and second outlets 224A, 224B. In variations, additional inlets (subject to constraints of the operating environment) and outlets can be used, with additional conduits, to cool the interior of the container 200.

In examples, the conduit structures 230, 232 are structured to separate the cool airflow of the inlet conduit 236, which is received from the first and second inlets 222A, 222B, from the warmed airflow of the outlet conduit 238, which exit the container 200 via the outlets 224A, 224B. This separation of cool and warm airflow allows for more efficient use of the conduit system 220. In examples, the conduit structures 230, 232 can effectively bisect the second inlet and outlet openings 222B, 224B so that an upper portion of each opening resides in the cool airflow region of the inlet conduit 236 and a lower portion of each opening resides in the warmed airflow region of the outlet conduit 238. In order to achieve the separation of cool and warm airflows, the second inlet and outlet openings 222B, 224B can include inlet and outlet barriers 225I, 225O, respectively. The inlet barrier 225I can be structured in the lower portion of the second inlet opening 222B to prevent the warmed airflow in the outlet conduit 238 from mixing with the cool airflow as the cool airflow enters the container 200 through the second inlet opening 222B. In addition, the outlet barrier 225O can be structured in the upper portion of the second outlet opening 224B to prevent the cool airflow in the inlet conduit 236 from being expelled from the container 200 through the second outlet opening 224B before reaching the lateral side 216.

Figure 2C:
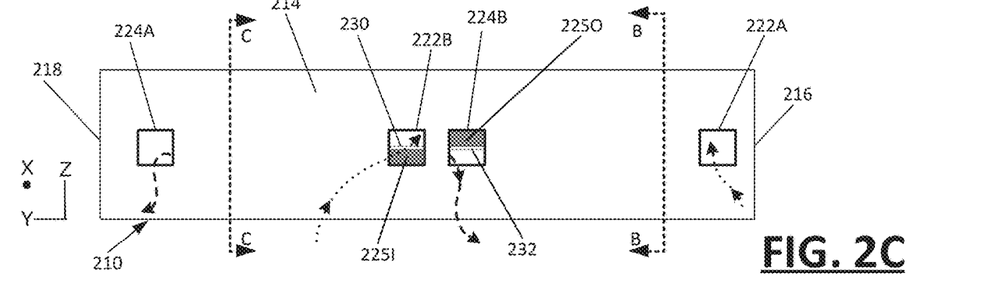
FIG. 2C illustrates a view of the back side of the example container of FIG. 2A.

FIG. 2C illustrates a view of the back side of the example container of FIG. 2A. As prescribed by the design restrictions discussed above, the inlet and outlet openings 222A, 222B, 224A, 224B can be included on a same side of the container. For example, the inlet and outlet openings 222A, 222B, 224A, 224B can be linearly arranged on the back side 214 of the container 200. Additionally, the design restrictions can further prescribe that the inlet and outlet openings 222A, 222B, 224A, 224B can be staggered in position, so that no set of inlet or outlets are adjacent to one another. The conduit system 220 can provide a workaround to separate or compartmentalize the cool and warmed airflows that would otherwise mix due to these design constraints (e.g., ISS rules, cabinet structure, etc.) which require that the inlet openings, which take in cool airflow, alternate with the outlet openings, which let out warmed airflow.

Figure 2D:
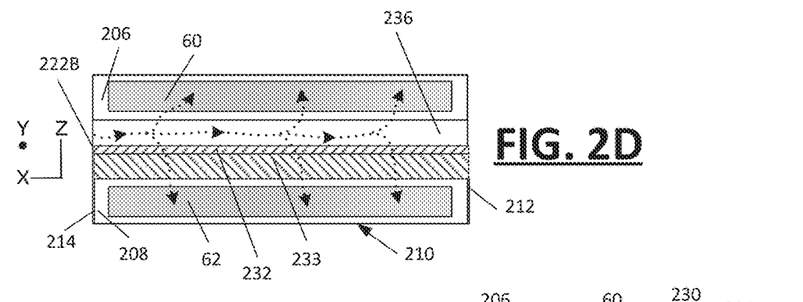
FIG. 2D illustrates a cross-sectional view of the example container of FIG. 2A, as viewed along lines B-B of FIG. 2C.
Figure 2E:
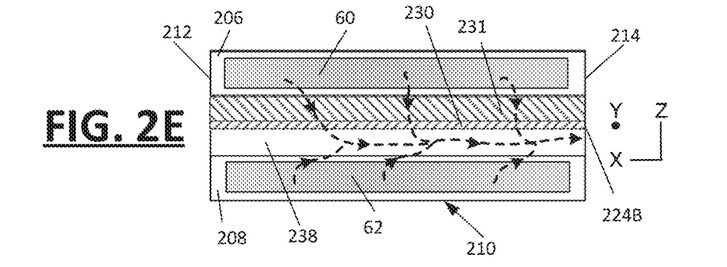
FIG. 2E illustrates another cross-sectional view of the example container of FIG. 2A, as viewed along lines C-C of FIG. 2C.

FIG. 2D illustrates a cross-sectional view of the container 200, cut along lines B-B of FIG. 2C. FIG. 2E illustrates a cross-sectional view of the container 200, cut along lines C-C of FIG. 2C. As shown, the conduit structures 230, 232 can occupy a space between the retention frames 206, 208, to form inlet and outlet conduits 236, 238. Additionally, the conduit structures 230, 232 can extend, depth-wise, from near the front side 212 towards a space that is near the back side 214. A resulting length of each of the conduit structures 230, 232 can thus correspond to a significant portion (e.g., 75% or more) of an overall length of the housing 210. As described below, the length of the conduit structures 230, 232 allows for channel regions (e.g., 237I in FIG. 2H) to form in front and back of the housing 210. For example, at least one channel region can form between the back side 214 and the back edges of the conduit structures 230, 232. As described in some examples, variations can provide for additional conduit features, such as a heat-exchanger or a structure to slow or change the airflow, to be positioned at various points along the conduits 236, 238.

Figure 2F:
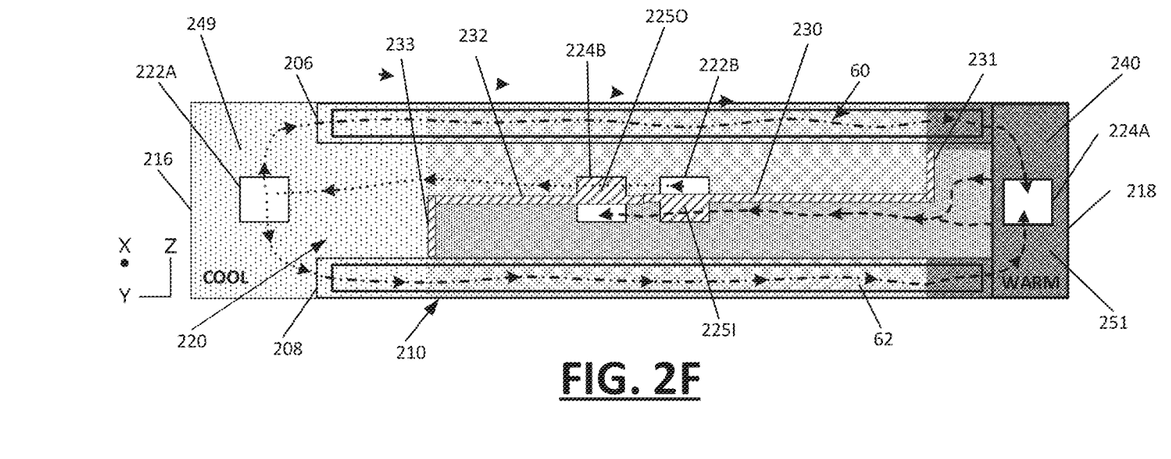
FIG. 2F illustrates a thermal mapping of an interior of the example container of FIG. 2A, as viewed from the front side.

FIG. 2F illustrates a thermal mapping of an interior container 200, as viewed from the front side. On the back side 214, the first inlet opening 222A is positioned proximally to the lateral side 216, and the first outlet opening 224A is positioned proximally to the lateral side 218. The second inlet opening 222B is positioned adjacent to the first outlet opening 224A, and the second outlet opening 224B is positioned adjacent to the first inlet opening 222A. Extending depth-wise into the container 200, the conduit system 220 provides each of an intake region 249 to receive the intake flow through the first inlet opening 222A, and an outtake region 251 to receive and collect warmed outflow air before it is exited through the first outlet opening 224A. The relative temperature of the intake region 249 is cool during operation, while the relative temperature of the outtake region 251 is warm. In examples, each of the intake and outtake regions 249, 251 can be tall, extending between top and bottom sides or segments of the container 200.

In a mid-region of the container 200, the airflow is layered, with warmer air occupying a vertically lower conduit that extends to the second outlet opening 224B, and cooler air being received at the second inlet opening 222B and occupying a vertically higher conduit that extends inward towards the front side 212.

Due to their close proximity, the second inlet and outlet openings 222B, 224B can include barriers to enable layering of the cool intake and warmed outtake flows in the mid-region of the container 200. For example, the second inlet opening 222B can include an inlet barrier 225I that pushes incoming cool air upwards into an upper conduit 236, where the cool airflow can travel towards the front side 212 of the container 220. Likewise, the second outlet opening 224B can include an outlet barrier 225O that precludes warmed outtake flow from rising or mixing with the cool airflow.

Figure 2G:
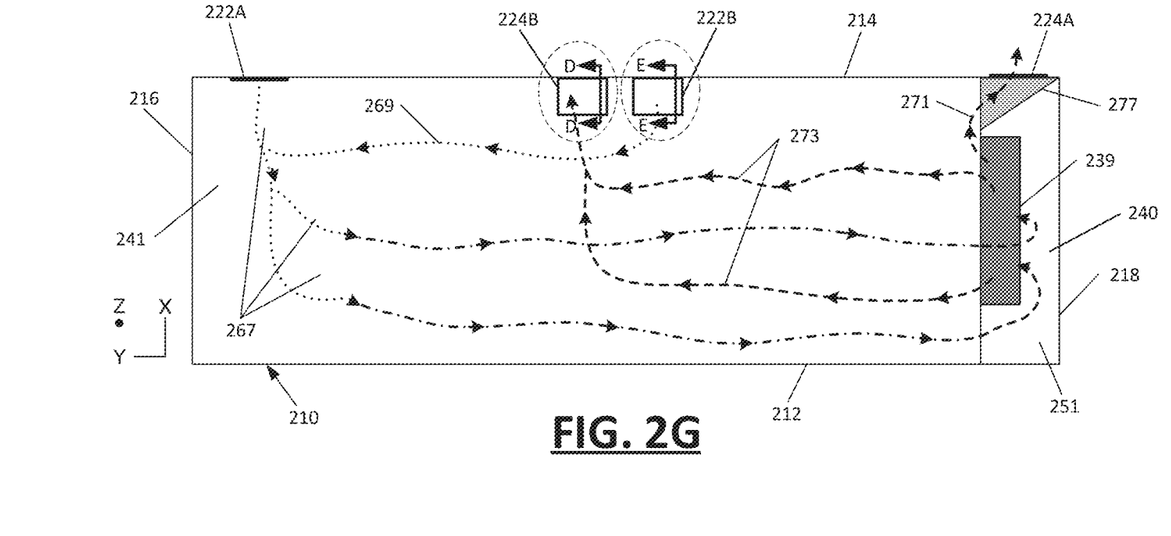
FIG. 2G illustrates an example airflow that is provided through the example container of FIG. 2A, as viewed from a top.

FIG. 2G illustrates an example airflow that is provided through the container 200, from a top view. As shown, various conduit structures 230, 232 (see FIG. 2B) can guide first and second intake flows 267, 269 received via each of the inlet openings 222A, 222B, from the front side 212 to the back side 214, and further from one lateral side 216 to another lateral side 218. The airflow is eventually expelled through the outlet openings 224A, 224B as first and second outtake flows 271, 273. Not only is the airflow guided through directional changes, but the conduit system 220 can slow the velocity of the airflow, so that warmer air stays longer within the volume of the container 200. This results in a more uniform cooling effect across a volume of the open region within the container 200.

As shown, another cool airflow can enter the container 200 through the second inlet opening 222B. As described with other examples, the conduit system 220 can be layered in the mid-region, with the cool air advancing as the second intake flow 269, from the mid region of the container towards the lateral side 216 and the front side 212. In this way, a front region 241 of the interior of the container 200 can thus receive and guide cool airflow from one lateral side 216 towards another lateral side 218.

In an example, the container 200 includes a heat exchanger 239 at or near the outtake region 251. This allows for warmer air to be received by the heat exchanger 239, and cooler air to be exited from the heat exchanger 239 as first outtake flow 271, which exits the back side 214 through the first outlet opening 224A.

In examples, the heat exchanger 239 and outtake region 251 can allow for warm air to collect, and further for back pressure to arise on the airflow. The back pressure can slow the airflow, and cause the airflow to split. At an equilibrium state (e.g., volume of incoming airflow is same as outgoing airflow), a second outtake flow 273 can form to carry warmed air through the mid-region, at the lower vertical level, to the second outlet opening 224B.

In examples, the conduit system 220 can employ wedges, stops, or other obstructive structures to manipulate the airflow. The first outtake flow 271 can, for example, be subjected to a wedge 277 and other channel structures, which cause the airflow to change (or substantially change) its lateral direction multiple times before exiting the container via the first outlet opening 224A. When positioned near the first outlet opening 224A to affect the first outtake flow 271, the wedge 277, for example, can further slow the warmed airflow, thereby increasing the exposure time of the warm air to the hotter interior, so as to enable further cooling before the outtake flow is expelled.

In examples, the conduit system 220 can utilize a power-drawing component of the computing device (e.g., fan). For example, fans of the computing devices 60, 62 can be utilized to indirectly create the pressure variation to move the airflow in a particular direction.

Figure 2H:
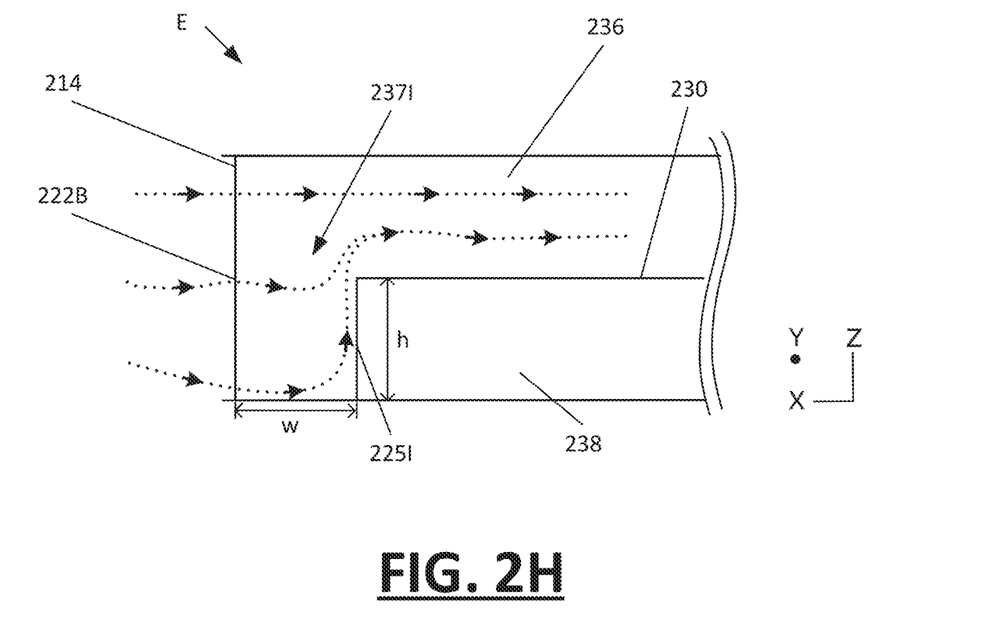
FIG. 2H illustrates a cross-sectional view of the example container of FIG. 2A, as viewed along line E-E of FIG. 2G.

FIG. 2H illustrates a cross-sectional view of the container 200, cut along line E-E of FIG. 2G. The container 200 can include a channel 237I proximate to the second inlet opening 222B, and situated between the back side 214 of the housing 210 and the back edge of the conduit structure 230. By setting back the back edge of the conduit structure 230 from the back side 214 of the housing 210 by a given width (w), the channel 237I can provide that the volumetric input of the cool airflow through the second input opening 222B can be about equal to the volumetric input of the cool airflow through the first input opening 222A. In addition, the channel 237I can include the inlet barrier 225I structured to a given height (h) that can correspond to a ceiling height of the outlet conduit 238. The cool airflow can enter the container 200 through the second inlet opening 222B and can then be pushed up to flow over the given height and to enter the inlet conduit 236.

Figure 2I:
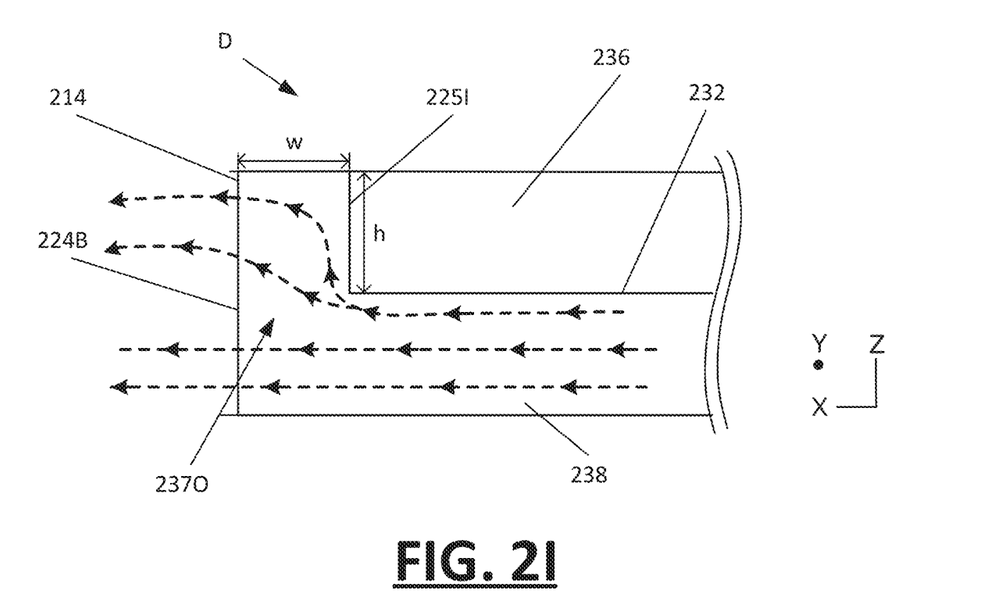
FIG. 2I illustrates a cross-sectional view of the example container, as viewed along line D-D of FIG. 2G.

FIG. 2I illustrates a cross-sectional view of the container 200, cut along line D-D of FIG. 2G. The container 200 can include a channel 237O proximate to the second outlet opening 224B, and situated between the back side 214 of the housing 210 and the back edge of the conduit structure 232. The channel 237O can include the outlet barrier 225O structured to a given height (h) that can correspond to a ceiling height of the conduit 236. In addition, the warmed airflow can travel through the conduit 238 and exit the container 200 through the second outlet opening 224B. By setting back the back edge of the conduit structure 230 from the back side 214 of the housing 210 by a given width (w), the channel 237O can provide a region into which the warmed airflow can expand so that the volumetric output of the warmed airflow through the second output opening 224B can be about equal to the volumetric output of the warmed airflow through the first outlet opening 224A.

Figure 3:
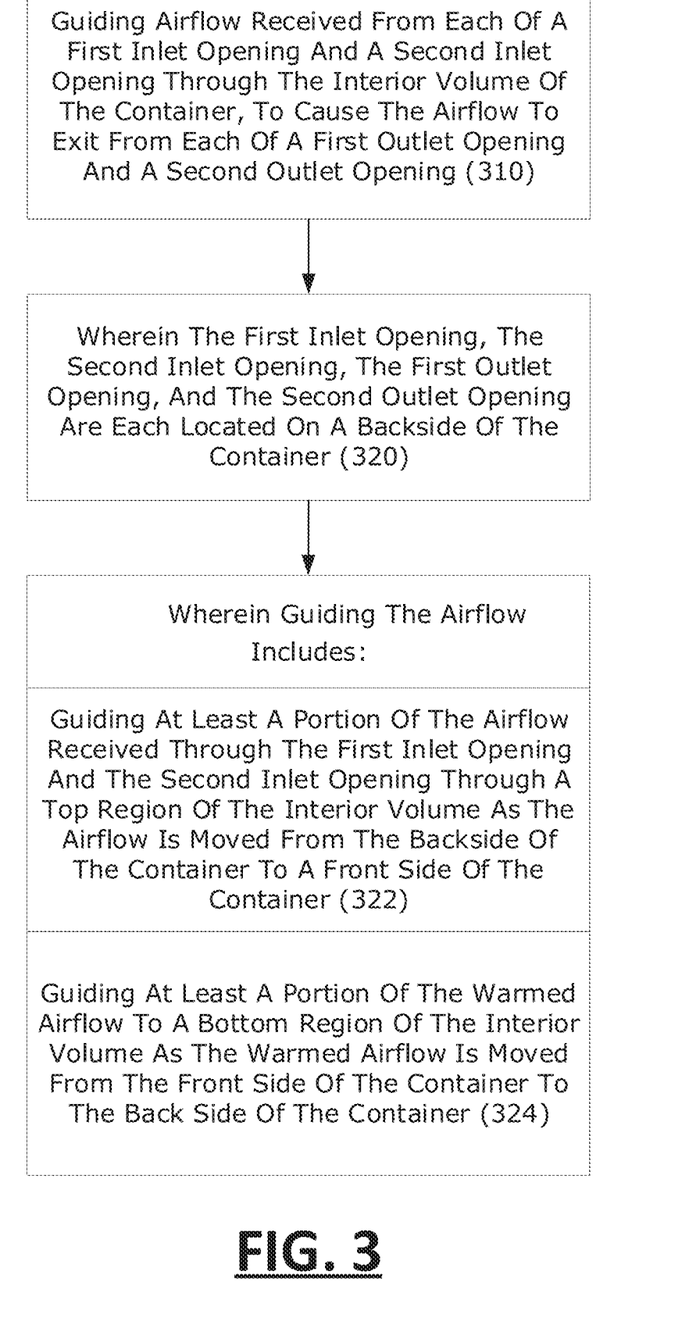
FIG. 3 illustrates an example method for cooling an interior volume of a container.

FIG. 3 illustrates a method for cooling an interior volume of a container. Example methods such as described by the examples of FIG. 3 can be implemented using example containers such as described with the examples of FIG. 1 and FIG. 2A through FIG. 2I. Accordingly, reference is made to the elements described with the examples of FIG. 1 and FIG. 2A through FIG. 2I to illustrate suitable components for implementing the method being described.

In FIG. 3, the container can guide the airflow received from each of a first and second inlet opening through the interior volume of the container and cause the airflow to exit from each of a first and second outlet opening (310). The first and second inlet openings and the first and second outlet openings can have a staggered arrangement so that each inlet opening is positioned adjacent to an outlet opening. The staggered arrangement can represent a design constraint (e.g., ISS rules) to which the container conforms.

In addition, the first and second inlet openings and the first and second outlet openings are each located on a same back side of the container (320). As such, the staggered arrangement on the same back side of the container means that the container must pass cool air adjacent to warm air. The container can be structured to include a conduit system so that the cool and warm airflows can be separated enough to provide adequate cooling to any electronic or computing devices retained within the container.

As such, guiding the airflow, by way of a conduit system of the container, can include guiding at least a portion of the airflow received through the first and second inlet openings through a top region of the interior volume as the airflow is moved from the back side of the container to a front side of the container (322). As the airflow travels from the back side of the container to the front side of the container, the airflow warms as it cools the computing devices retained within the container. In addition, the container can be structured to slow the airflows and lengthen an exposure time of air within the container as the airflow is warmed. In this way, the container can effectively and substantially uniformly cool computing devices retained within the container even though such computing devices (e.g., rack servers) may not be designed or intended to be cooled in such a manner.

Further, guiding the airflow, by way of the conduit system, can also include guiding at least a portion of the warmed airflow to a bottom region of the interior volume as the warmed airflow is moved from the front side of the container to the back side of the container (324). In variations, the container can include additional features (obstructive devices, heat exchangers, fans, etc.) to aid in cooling the warmed airflow and guiding the warmed airflow through the bottom region of the interior volume as the airflow is expelled through the first and second outlet openings.

It is contemplated for examples described herein to extend to individual elements and concepts described herein, independently of other concepts, ideas or systems, as well as for examples to include combinations of elements recited anywhere in this application. Although examples are described in detail herein with reference to the accompanying drawings, it is to be understood that the concepts are not limited to those precise examples. Accordingly, it is intended that the scope of the concepts be defined by the following claims and their equivalents. Furthermore, it is contemplated that a particular feature described either individually or as part of an example can be combined with other individually described features, or parts of other examples, even if the other features and examples make no mention of the particular feature. Thus, the absence of describing combinations should not preclude having rights to such combinations.

What is claimed is:

1. A container comprising:
    a housing which retains at least a first computing device, the housing including a plurality of sides, including a front side corresponding to a front side of the container, and a back side corresponding to a back side of the container;
    wherein the housing provides for a first inlet opening, a second inlet opening, a first outlet opening and a second outlet opening on the back side;
    a conduit system provided within the housing to guide an airflow received from each of the first inlet opening and the second inlet opening through an interior volume of the container, to cause the airflow to exit from each of the first outlet opening and the second outlet opening; and
    wherein the conduit system includes a plurality of structures that combine to guide at least a portion of the airflow received through the first inlet opening and the second inlet opening through a top region of the interior volume as the airflow is moved from the back side of the container to the front side of the container, and to guide at least a portion of a warmed airflow to a bottom region of the interior volume as the warmed airflow is moved from the front side of the container to the back side of the container,
    wherein the second inlet opening includes an inlet barrier in a lower portion of the second inlet opening, wherein the inlet barrier pushes cool airflow received from the second inlet opening upwards and prevents the warmed airflow from mixing with the cool airflow, and
    wherein the second outlet opening includes an outlet barrier in an upper portion of the second outlet opening, wherein the outlet barrier prevents the cool airflow from being expelled through the second outlet opening and further precludes the warmed airflow from rising or mixing with the cool airflow.

2. The container of claim 1, wherein the conduit system is structured to manipulate the airflow, to uniformly cool an area of the first computing device.

3. The container of claim 1, wherein the housing further retains a second computing device, wherein the first computing device and the second computing device are vertically spaced apart within the housing, and wherein the conduit system is structured to manipulate the airflow, to uniformly cool an area of each of the first computing device and the second computing device.

4. The container of claim 3, wherein the conduit system is structured to manipulate the airflow, to cool each of the first and second computing devices by a substantially equal amount.

5. The container of claim 1, wherein the conduit system is structured to layer at least a mid-region of the container into a top region and a bottom region, wherein the top region of the mid-region carries one of cooler or warmer airflow, and the bottom region of the mid-region carries the other of the cooler or warmer airflow.

6. The container of claim 5, wherein the conduit system is structured to carry at least a second outtake flow in the bottom region of the mid-region, the second outtake flow being carried to the second outlet opening.

7. The container of claim 5, wherein the conduit system is structured to carry at least a second intake flow in the top region of the mid-region, the second intake flow being carried inward from the second inlet opening.

8. The container of claim 1, wherein the conduit system is structured to slow the airflows and lengthen an exposure time of air within the container as the airflow is warmed.

9. The container of claim 8, wherein the conduit system includes an obstructive structure that causes the airflow to change direction.

10. The container of claim 9, wherein the obstructive structure is a wedge.

11. The container of claim 1, wherein the conduit system includes a heat exchanger.

12. The container of claim 1, wherein the first inlet opening, the second inlet opening, the first outlet opening, and the second outlet opening are spaced apart on the back side of the container, with the first inlet opening being adjacent to the second outlet opening, and the first outlet opening being adjacent to the second inlet opening, and the first inlet opening being distal to the first outlet opening.

13. A cabinet assembly comprising:
a cabinet including:
a cabinet housing to provide a pair of bays on at least a first level, each bay of the pair including a first cabinet opening to receive a coolant conduit and a second cabinet opening to receive an exhaust conduit;
a container including:
a housing dimensioned to extend across each bay of the pair, the housing including a front side corresponding to a front side of the container and a back side corresponding to a back side of the container, the back side including a first inlet opening to receive the coolant conduit of a first bay of the pair, a second inlet opening to receive the coolant conduit of a second bay of the pair, a first outlet opening to receive the exhaust conduit of the second bay, and a second outlet opening to receive the exhaust conduit of the first bay;
a conduit system provided within the housing to guide the airflow received from each of the first inlet opening and the second inlet opening through an interior volume of the container, to cause the airflow to exit from each of the first outlet opening and the second outlet opening; and
wherein the conduit system includes a plurality of structures that combine to guide at least a portion of the airflow received through the first inlet opening and the second inlet opening through a top region of the interior volume as the airflow is moved from the back side of the container to the front side of the container, and to guide at least a portion of the warmed airflow to a bottom region of the interior volume as the warmed airflow is moved from the front side of the container to the back side of the container.

14. The cabinet assembly of claim 13, wherein the housing is structured to retain at least a first computing device.

15. The cabinet assembly of claim 14, wherein the conduit system is structured to manipulate the airflow, to uniformly cool an area of the first computing device.

16. The cabinet assembly of claim 13, wherein a first computing device and a second computing device are vertically spaced apart within the housing, and wherein the conduit system is structured to manipulate the airflow, to uniformly cool an area of each of the first computing device and the second computing device.

17. The cabinet assembly of claim 16, wherein the conduit system is structured to manipulate the airflow, to cool each of the first and second computing devices by a substantially equal amount.

18. The cabinet assembly of claim 13, wherein the conduit system is structured to layer at least a mid-region of the container into a top region and a bottom region, wherein the top region of the mid-region carries one of cooler or warmer airflow, and the bottom region of the mid-region carries the other of the cooler or warmer airflow.

19. The cabinet assembly of claim 13, wherein the conduit system includes a heat exchanger.

* * * * *